United States Patent [19]
Michael

[11] Patent Number: 5,999,151
[45] Date of Patent: *Dec. 7, 1999

[54] PIXEL, VIDEO DISPLAY SCREEN AND POWER DELIVERY

[76] Inventor: Robert Michael, c/o Dock & Associates 2 Vincent Street, Marrickville NSW, Australia, 2204

[*] Notice: This patent issued on a continued prosecution application filed under 37 CFR 1.53(d), and is subject to the twenty year patent term provisions of 35 U.S.C. 154(a)(2).

[21] Appl. No.: 08/464,627
[22] PCT Filed: May 11, 1993
[86] PCT No.: PCT/AU93/00212
§ 371 Date: Jun. 26, 1995
§ 102(e) Date: Jun. 26, 1995
[87] PCT Pub. No.: WO94/15434
PCT Pub. Date: Jul. 7, 1994

[30] Foreign Application Priority Data

Dec. 24, 1992 [AU] Australia .................. PL 6587

[51] Int. Cl.$^6$ ........................................ G09G 3/32
[52] U.S. Cl. ............... 345/83; 313/500; 313/113
[58] Field of Search ................. 345/83, 208, 82, 345/903, 905; 313/500, 113

[56] References Cited

U.S. PATENT DOCUMENTS

| 4,771,274 | 9/1988 | Havel | 345/83 |
| 4,810,937 | 3/1989 | Havel | 313/500 |
| 4,942,392 | 7/1990 | Loert et al. | 345/82 |
| 5,122,733 | 6/1992 | Havel | 345/83 |
| 5,184,114 | 2/1993 | Brown | 345/83 |
| 5,194,854 | 3/1993 | Havel | 345/83 |

FOREIGN PATENT DOCUMENTS

| 2-280188 | 11/1990 | Japan | 345/82 |
| 3-296793 | 12/1991 | Japan | 345/82 |

Primary Examiner—Jeffery Brier
Attorney, Agent, or Firm—Testa, Huwitz & Thibeault LLP

[57] ABSTRACT

The invention provides a pixel having a light emitting surface, the pixel containing at least a set of tristimulus colors in light emitting diodes embedded in a light scattering medium which includes the light emitting surface characterised in that the light emitting surface is non-focsing. The invention also provides a video display screen constructed from a plurality of pixels and apparatus for delivering power to the screen.

16 Claims, 2 Drawing Sheets

PIXEL, VIDEO DISPLAY SCREEN AND POWER DELIVERY

TECHNICAL FIELD

This invention relates to pixels ("picture elements") especially suitable for use in video displays. In addition, this invention relates to video displays, particularly large scale video displays, using the pixels of the invention, and to power delivery to such screens.

BACKGROUND ART

It is known to use discrete light emitting diodes (LEDs) for signalling and for graphic displays. LEDs have been available in red and green for some time, and, more recently, blue LEDs have become available; combinations of these colours have the ability to produce all colours, including white. U.S. Pat. Specification No. 4,992,704 describes the combination of red, green and blue LEDs in a unitary housing, of transparent or translucent material, to support red, green and blue LEDs in fixed, spaced relationship to each other. The housing is domed to form a lens; the purpose of the lighting device is to enable a signalling device or lamp to produce all colours in the visible light spectrum. Thus the signalling device or lamp can exhibit a change in colour, signalling a change in state.

It has now been found that a combination of red, green and blue LEDs can be used in connection with video screens, to produce a screen which has properties far superior to those presently experienced.

In various situations, it is desirable to use large screens of approximately billboard size. A major use of such screens is in shopping centres and malls, where large video screens can be use for point of sale advertising or entertainment.

Existing large video screen suffer from a major drawback. All displays on such screens include vertical and horizontal black lines. These arise because of the technology involved in translating the display to the large screen. Prior art screens are based on conventional cathode ray tubes, or use a rear projection three gun system, In every case, the resultant display on the large screen contains gaps, which appear as vertical and horizontal black lines, giving the display a "pasted" effect.

It is an object of the present invention, in one embodiment thereof, to provide a large screen which is capable of a video display in which these vertical and horizontal black lines cannot be detected visually.

Prior art screens also have the disadvantage of being quite bulky, For example, in the case of rear projection screens, any sized viewing area typically will be about two metres thick.

It is an object of the present invention, in an embodiment thereof, to provide a large screen which is substantially slimmer than these prior art screens.

Large video screens in current use also have other problems which make it difficult to use them in situations where normal/high ambient light conditions, wide viewing angle and short viewing distance prevail, for example, in shopping malls. Prior art large screen video displays suffer from one or more of the following problems: large grain (pixel) size, low light output and excessive directionality. As a consequence, the video images on these large screens often appear faded or dim and in addition cannot be seen clearly at oblique angles or at short viewing distances.

It is therefore another object of this invention to provide large screen video displays with high light output (brightness), high resolution and a wide viewing angle. It is a further object of the present invention to provide a large screen video display capable of producing photo-realistic images in full colour, with imperceptible flicker under all practical viewing conditions or image content, and free of image degradation due to gaps, motion smearing and directionality caused by physical limitations of the display medium.

In relation to large video screens, there is a problem in delivering power. Prior art methods of delivering power rely on the use of multi-stranded low resistance cable. In such a configuration, it is very difficult to minimise the loop area formed by the load, the power supply and the power supply leads. This results in lead inductance and transient oscillation on the power supply by the fast switching of It is a further object of this invention in one embodiment thereof, to overcome the problems faced by the prior art methods and to deliver power to large video screen with a minimisation of direct current voltage drop and amplitude of the transient oscillation induced on the power supply by switching of the LEDs.

DISCLOSURE OF THE INVENTION

Accordingly, the present invention provides a pixel having a light emitting surface the pixel containing at least a set of tristimulus colours in light emitting diodes embedded in a light scattering medium which includes the light emitting surface, characterised in that the light emitting surface is non-focusing and further characterised in that an optical barrier is associated with the pixel so that, when two or more of the pixels form an array, each of the pixels is separated from the or each neighbouring pixel by an optical barrier.

Preferably, the pixel of the invention contains one each red and green light emitting diodes (LED chips) and two blue LED chips. (A set of tristimulus colours in this case comprises red, green and blue.) It is further preferred that the LED chips are packaged in two lead frames, with the red and green LED chips on one lead frame and the two blue LED chips on the other lead frame.

While it is possiible to mount the red, green and blue LED chips on a special header and activate them in turn, it is preferred to mount them on two separate lead frames and activate the LED chips in pairs, concurrently, increasing the duty cycle and consequently the light output obtained from the pixel.

The use of two lead frames also substantially increases the thermal conductivity between the junction of each LED and the ambient, resulting in a lower junction temperature for a given electrical power dissipation. This permits a greater power dissipation in the LEDs, while maintaining their conversion efficiency (ratio of radiant output power to electrical input power), so increasing the available light output from the pixel.

At present, blue LEDs provide less light output than red or green LEDs. This limits the light output of the pixel because to generate a full spectrum of colour the tristimulus colours, red, green and blue, must be combined in specific proportions. The use of two lead frames permits pairs of LEDs to be activated concurrently and can be used to increase the intensity of the blue relative to the red and green band thereby that of the pixel as a whole. This can be achieved by mounting the red and green LEDs on one lead frame and the two blue LEDs on the other. The LEDs are then activated in pairs, blue and red and blue and green.

This increases the intensity of the blue component because it is activated twice as often as either the red or green component.

It is further preferred that the two lead frames support the four LEDs at the corners of a rectangle.

Because blue LEDs with enhanced light output may soon be available, it is contemplated that the pixel of the invention may have only three LEDs: one each red, green and blue. Two lead frames may still be used, with the blue LED on one frame and the red and green LEDs on the other frame, for example. In this case, the two lead frames would support the three LEDs at the apices of a triangle.

The light emitting surface in non-focusing. Preferably, the surface is substantially flat, However, other configurations are permissible, provided the surface is non-focusing. For example, the surface may be textured.

The light emitting surface is preferably square, because this increases spatial efficiency, which in turn increases the brightness of the display, and the perceived spatial resolution, without the need to increase the number of pixels.

However, it is to be understood that the light emitting surface may be of any other suitable shape, provided the light emitting surface is substantially symmetrical about the x and y axes. Thus, the surface may be circular or hexagonal or perhaps dodecagonal, for example. However, pixels with circular faces will not achieve the optimum results possible with pixels of square faces, as further explained, below.

The light scattering medium (and the light emitting surface) may be chosen from any suitable substance, but is preferably an epoxy resin containing a light scattering material, such as powdered glass, dispersed therethrough. Any other suitable material may be used, provided the end result is a pixel having LED chips encapsulated in an optically transparent medium with a scattering material dispersed throughout.

As stated, the light emitting surface of the pixel of the invention is substantially flat and preferably square in shape. The encapsulation acts as a light pipe carrying light emitted by the LED chip or dis to the emitting surface, while the scattering material ensures that the light is uniformly distributed over the emitting surface and direction. Prior art pixels use a focusing mechanism (lens) to obtain a uniformly illuminated emitting surface, which concentrates the light emitted by the pixel substantially in the forward direction.

The scattering material in the pixel of the invention also promotes additive colour mixing of the tristimulus colours (red, green and blue) to ensure the composite colour uniformly illuminates the emitting surface. This improves spatial efficiency and therefore perceived resolution, provides a very wide viewing angle, enhances additive colour mixing to achieve better colour rendering and improves the contrast ratio of the pixel.

The present invention also provides a screen constructed from a plurality of pixels of the invention.

In a preferred embodiment, the screen of the invention is comparable in size to a billboard, is capable of showing a video with a field of view that exceeds 150 degrees and is viewable at short distances, such as seven metres, under high ambient light conditions, with image quality comparable to that of broadcast television.

This invention also provides a method of constructing a video display screen, the method comprising assembling a plurality of the pixels of the invention, preferably in a square array, and inserting an optical barrier between each pixel and a neighbouring pixel.

The optical barrier may be chosen using any technology suitable for this purpose. It is highly desirable that the optical barrier has white or light-coloured material around each pixel and that a dark, preferably black, edge is presented to the viewer.

Preferably, the optical barrier is made of plastic and consists of a black core sandwiched between two layers of white. The purpose of the barrier is to reflect light, emitted through sides of a pixel, back into that pixel. Consequently, the optical barrier is oriented so that the white layers lie alongside the pixel sides. The black core is intended to be apparent when the pixels are viewed from their front faces. Thus, it is preferred that in the width of the white-black-white sandwich, the black core occupies at least 90%.

To generate animated colour images requires pixels which can emit light over the full spectrum of colours. It is possible to simulate this using pixels comprising red, green and blue light sources. The illusion of being able to create a full spectrum of colours is achieved by combining the tristimulus colours in specific proportions. This is done by controlling the intensity of the red, green and blue light sources that comprise the pixel. The additive colour mixing which crates the illusion of colour becomes progressively better the closer the sources are to one another in the pixel.

High resolution and high brightness in large area video displays (comparable to billboard) may be achieved using the pixels of the present invention. In particular, the resolution and brightness of the display will be maximised if the pixel face is made square. It is conventional practice in the constructions of large area displays to locate the pixels at the nodes of a square grid. Prior pixels have had circular faces and when set on a square grid fail to illuminate approximately 27% of the available display surface, given they have the same linear dimensions as square pixels of the present invention. This results in increased "graininess" and reduced brightness. The increased graininess is perceived as a reduction in resolution.

The flat face of the pixel and use of a scattering material to obtain uniform illumination of its emitting surface instead of a focusing mechanism (lens) as in the prior art ensures the resultant display has a wide viewing angle. It is estimated that, independent of the site of the picture area, a video display screen using pixels of the invention will be only 33 cm thick, as compared with 2 metres in the case of prior art screens. It will be appreciated that this advantage alone represents a significant advance over the prior art.

It will be appreciated by those skilled in the art there is a significant difficulty in delivering power to a panel of LEDs assembled to form a large video screen, in which the LEDs are individually pulse-width modulated to control their average light output. Since the light output from the LEDs is controlled by pulse-width modulation, any oscillation on the power supply will vary the pulse amplitude and interfere with the modulation process.

According, this invention also provides a method of delivering power to a video display screen. The video display screen includes a large physically distributed, high current, fast switching, pulsed load where the pulse width varies randomly in time and with the physical space of the load, the method comprising using closely spaced planes to distribute the power, each plane being fed with power at or towards the centre thereof.

This invention also provides apparatus for delivering power to a video display screen. The video display screen includes a large physically distributed, high current fast switching, pulsed load where the pulse width varies randomly in time and with the physical space of the load, the apparatus including closely spaced planes adapted to distribute the power when fed with power at or towards the centre thereof.

Preferably, the planes are in pairs and are made of copper. However, other materials may also be suitable, such as aluminium or silver, for example.

It has been found that, by feedding the planes from the centre, power supply lead inductance is virtually eliminated. This minimises the amplitude of the oscillations induced on the power supply by the LEDs being switched. It also minimises the direct current resistance and hence the voltage drop on the power supply feed. This can be particularly significant when the power supply is required to deliver 600 Amps.

BRIEF DESCRIPTION OF THE DRAWINGS

The invention will now be described in connection with a preferred embodiment illustrated in the accompanying Drawings, in which:

Rule 1 shows in sixteenths and thirty-seconds of inches the dimensions of the pixel in FIGS. 1 and 2. Referring now to FIG. 1, 2 and 3, pixel 10 has a light emitting face 12 measuring 4.5 mm by 4.5 mm.

Figure 1:
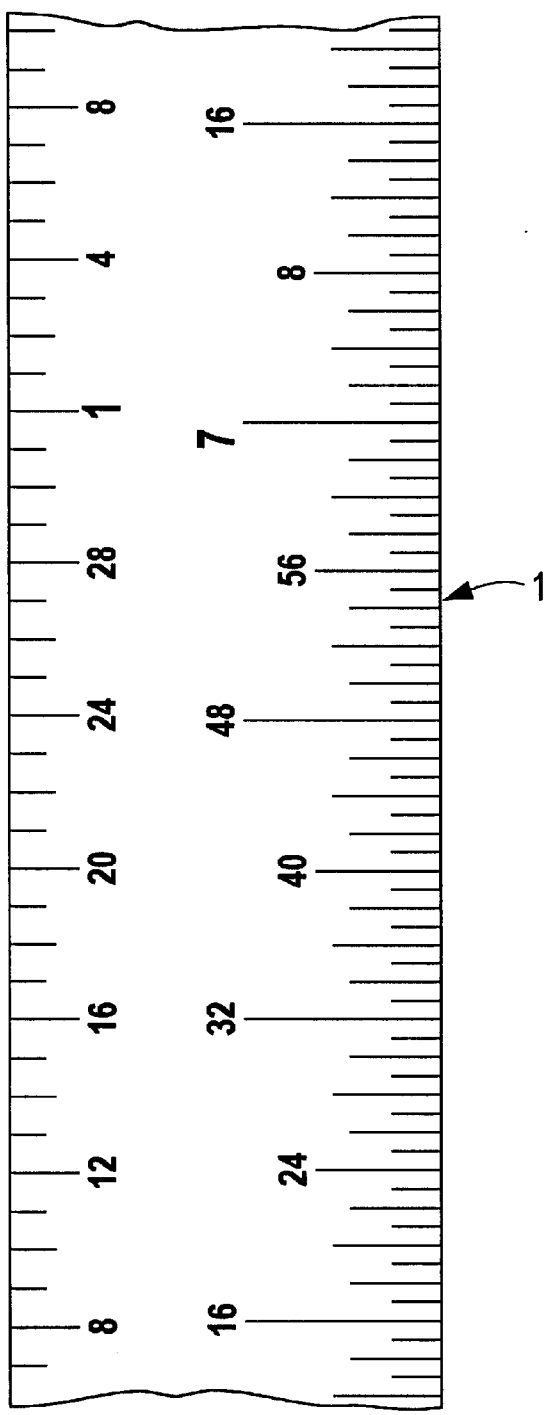
FIG. 1 is a partial front elevation of an embodiment of the pixel of the invention.
Figure 1:
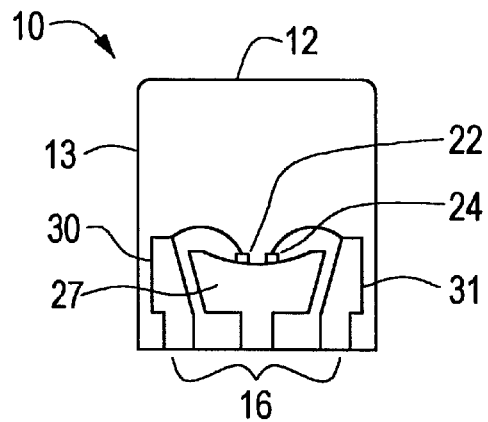
Figure 2:
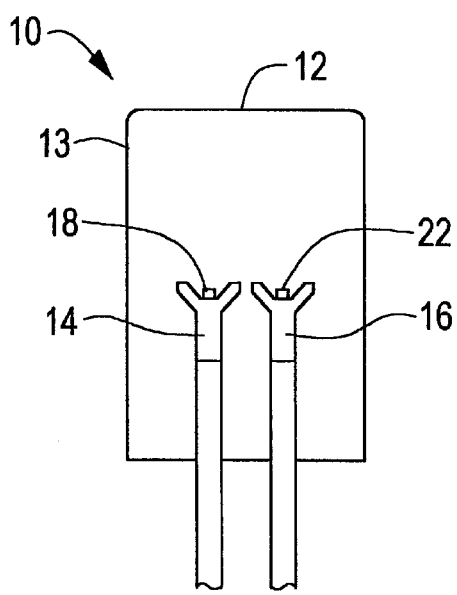
FIG. 2 is an end elevation of the pixel of FIG. 1.
Figure 3:
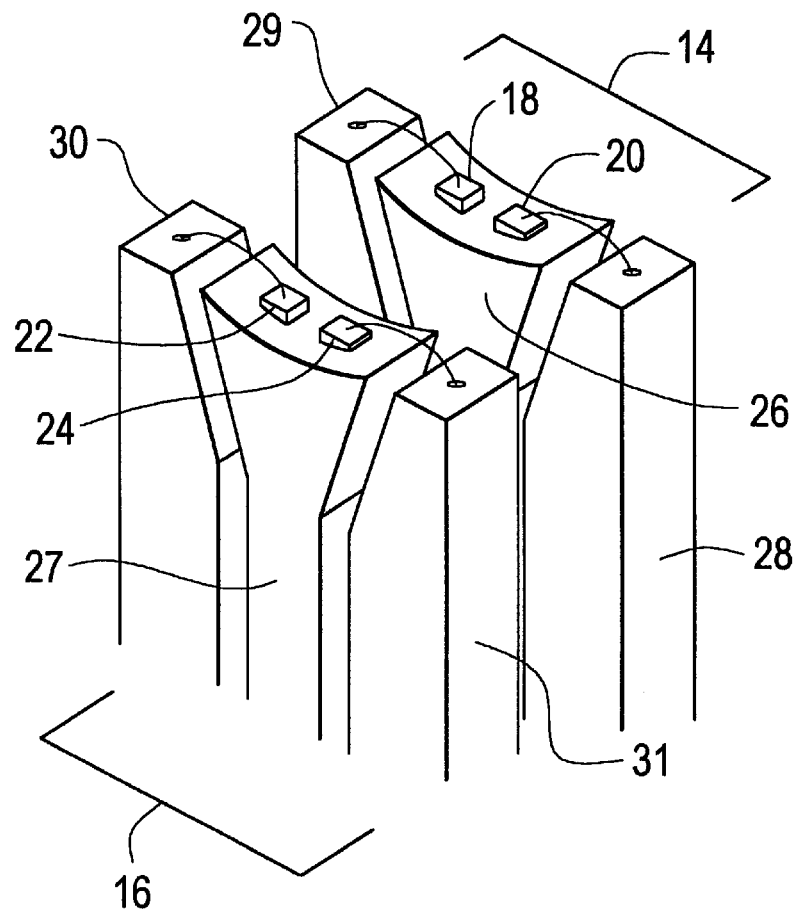
FIG. 3 is a perspective view of a detail of the pixel of FIGS. 1 and 2.

Face 12 is formed as a planar surface on light scattering medium 13, made of an epoxy compound containing powdered glass uniformly dispersed therethrough. Embedded in medium 13 are two lead frames 14 and 16. Frame 14 carries two blue LED chips 18 and 20, while frame 16 carries one red LED chip 22 and one green LED chip 24. The four LED chips 18, 20, 22 and 24 are supported at the corners of a rectangle measuring 0.6 mm by 1.6 mm.

Electrical integrity has been achieved by keeping lead frames 14 and 16 separated during cure of the epoxy compound. Cathodes are indicated at 26 and 27, while anodes are indicated at 28, 29, 30 and 31.

Optical characteristics of pixel 10 can be controlled by the distance between the lead frames 14 and 16, the distance between LED chips 18, 20, 22 and 24 and front face 12 (4.0 mm in this case) and the grit size of the powdered glass.

It will be appreciated that LED chips 18, 20, 22 and 24 have been "potted" in medium 13, to form a light pipe around the LED chips. This light pipe effectively carries light to the front face 12 of pixel 10 and greatly enhances brightness.

Optical barriers 15 and 17 are for the purpose of preventing light leakage into pixels (not shown) adjoining barriers 15 and 17. The surface of each of barriers 15 and 17, where they adjoin pixel 10 and the adjacent pixels, are clad with a white surface so that light which would otherwise travel through light scattering medium 13 into an adjoining pixel is reflected by barrier 15 or 17 back into the original pixel 10. As a result, each pixel 10 produces a true reproduction of colour without any colour "halo" effect, which would be encountered if barriers 15 and 17 were not interposed between pixel 10 and adjacent pixels. Thus the image conveyed by an array of pixels 10 of the invention is sharp and clear.

A plurality of pixels 10, when assembled in a square array, forms a large screen video display which has a seamless picture area (no gaps), unlike prior art large screen video displays.

The screen of the invention addresses the problems of photo-realism (high resolution, hue, saturation and luminance, smooth motion, good colour mixing, high contrast ratio being free from artifacts), high brightness and wide field of view, as follows.

In relation to photo-realism, high resolution, is determined by the linear dimension of the pixel face 12, its shape and uniform illumination. Because the face 12 of pixel 10 measures 4.5 mm by 4.5 mm, it is possible to construct a display measuring at least 2.6 metres by 3.5 metres (8 feet, 8 inches by 11 feet, 6 inches) having a spatial resolution of 25 cycles per degree of viewing angle. This exceeds that required to support broadcast quality video.

Spatial efficiency (the ratio of the total illuminated area to the total geometric area of the display) is determined by the shape and by the even illumination of the pixel face 12.

Since the pixels 10 are positioned on a square grid, the square face 12 of each pixel 1 and its even illumination results in high spatial efficiency which increases perceived spatial resolution beyond that determined purely by the linear dimension of pixel face 12.

The hue, saturation and luminescence requirements of photo-realism are met by switching the blue, red and green LED chips 18 20, 22 and 24 at seeds of 800 nS. This makes it possible to provide 128 levels of intensity control for each of the LED chips 18, 20, 22 and 24 in the pixel 10.

This is sufficient to produce over 2 million colour/intensity combinations, which exceeds that required to support broadcast quality video.

In addition, the switching speed of the pixel 10 readily supports a refresh rate of 60 frames (non-interlaced) per second, which is more than sufficient to avoid any jerkiness when displaying motion. Thus the smooth motion requirement of photo-realism is attained.

With regard to good colour mixing, a full colour spectrum can be achieved by mixing various amounts of red (626 nm), green (569 nm) and blue (470 nm) light. Additive colour mixing becomes complete when the observer can no longer distinguish the individual red, green and blue light sources. This occurs when the greatest distance between any two of the light sources subtends an angle of one minute of arc at the eye of an observer with 20/20 vision. In the case of the screen of the present invention, this occurs at a distance of 5.86 metres (19.25 feet), which ensures excellent colour rendition even at a relatively close viewing distance of 6.5 metres (21 feet) from the screen.

As to high contrast ratio, it is to be understood that in the "off" state, LEDs emit no light, so the "on" to "off", or contrast, ratio is limited only by the amount of ambient light reflected back by the pixel in the "off" state. In the pixels of the invention, this is minimised because no lens is used to illuminate the emitting surface of the pixel: the pixel face 12 is flat. Any light entering the front face 12 is scattered, attenuating the amount that reaches the reflector used to collect the light emitted by the LED and direct it toward the pixel face 12. The only other way ambient light might be reflected back is by specular reflection from the front face 12. However, for that to be significant, the ambient light source would have to be concentrated near the observer. The high contrast ratio in the screen of the present invention preserves the available range of intensity control, enhancing photo-realism.

Flicker and image smearing are artifacts often encountered in screens built using slow switching pixels. Both are eliminated in the screen of the present invention, by using LED chips capable of high inherent switching speed.

Image distortion (for example, circles appearing as ellipses) is prevented by locating pixels 10 on a square grid.

The problem of high brightness is addressed by maximising the light output and spatial efficiency of the pixel 10. Spatial efficiency has already been discussed, above. To maximise brightness, LED chips 18, 20, 22 and 24 are multiplexed, relying on the operation of the observer's eye as a peak detector. The use of two lead frames 14 and 16 in this context has two major benefits. First, power dissipation is significantly improved, so that LED chips 18, 20, 22 and 24 can be driven harder, thus increasing brightness. Secondly, it is possible to drive the two pairs of LED chips independently, effectively increasing the duty cycle and increasing brightness.

The problem of wide field of view is solved by the use of light scattering material 13 to randomise the direction and location of light reaching face 12 of pixel 10. This in turn results in a uniform and wide—approximately 160 degree—field of view for pixel 10. A display screen constructed of a plurality of pixels 10 will have the same wide field of view.

Figure 4:
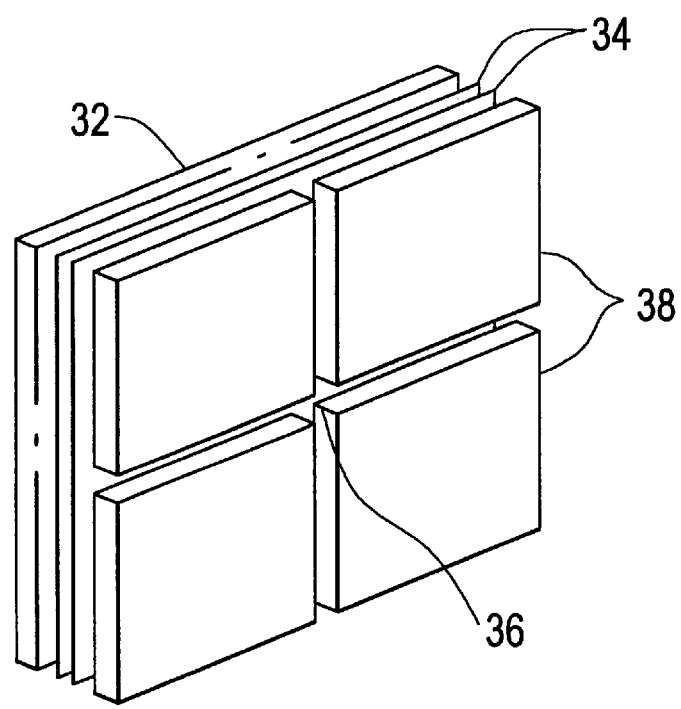
FIG. 4 is a perspective view of an array of pixels having associated therewith power distribution apparatus according to the invention.

With reference to FIG. 4, an array 32 of pixels 10 is backed by a pair of power distribution planes 34 fed at the centre 36 thereof by drive electronics 38. The power distribution planes 34 illustrated are suitable for delivering power (typically 10 volts at 600 Amps) to an array 32 of 128 by 128 pixels 10, i.e., 16,384 LEDs, comprising a screen measuring 700 mm by 700 mm, each of the pixels being individually pulse-width modulated.

Although the invention has been described in connection with red, green and blue LED chips, it is contemplated that the pixel of the invention may be made up of other tristimulus colours, such as magenta, cyan and yellow, for example.

INDUSTRIAL APPLICATION

It will be appreciated that the pixel, the screen and the power delivery of the present invention represent a significant advance in the art and have widespread industrial applicability. It will further be appreciated by one skilled in the art that variations may be made in connection with the invention as described here without departing from the spirit and scope thereof.

What is claimed is:

1. A pixel for a video display screen, said pixel comprising:
   a light scattering medium having a non-focusing light emitting surface;
   a plurality of light emitting diodes emitting a set of tristimulus colors, each light emitting diode emitting one color from said set of tristimulus colors, said light emitting diodes being embedded in said light scattering medium; and
   a light reflecting barrier surrounding the pixel, whereby when two or more pixels form an array, each of the pixels is separated by said light reflecting barrier.

2. The pixel as claimed in claim 1, wherein the pixel contains one each red and green light emitting diodes and two blue light emitting diodes.

3. The pixel as claimed in claim 2, wherein the diodes are packaged in two lead frames, the red and green diodes being on one lead frame and the two blue diodes being on the other lead frame.

4. The pixel as claimed in claim 3, wherein the diodes are adapted to be activated in pairs, concurrently, one pair comprising a blue and a red diode and the other pair comprising a blue and a green diode.

5. The pixel as claimed in claim 3, wherein the two lead frames support the four diodes at the corners of a rectangle.

6. The pixel as claimed in claim 1, wherein the pixel contains one red light emitting diode, one green light emitting diode and one blue light emitting diode.

7. The pixel as claimed in claim 1, wherein the light emitting surface is substantially flat.

8. The pixel as claimed in claim 7, wherein the light emitting surface is square.

9. The pixel as claimed in claim 1, wherein the light scattering medium consists of an epoxy resin containing a light scattering material dispersed therethrough.

10. The pixel as claimed in claim 9, wherein the light scattering material is powdered glass.

11. The pixel as claimed in claim 1, wherein the light reflecting barrier is made of plastic and consists of a black core sandwitched between two layers of white.

12. The pixel as claimed in claim 11, wherein the black core occupies at least 90% of the width of the white-black-white sandwich.

13. A video display screen constructed from a plurality of pixels as claimed in claim 1.

14. The screen as claimed in claim 13, wherein the pixels are assembled in a square array.

15. The screen as claimed in claim 13, which comprises a large physically distributed, high current, fast switching, pulsed load in which the pulse width varies randomly in time and with the physical space of the load.

16. A method of constructing a video display screen, the method comprising assembling a plurality of pixels as claimed in claim 1, and inserting an light reflecting barrier between each pixel and a neighbouring pixel.

* * * * *